United States Patent
Rahman

(10) Patent No.: US 7,895,489 B2
(45) Date of Patent: Feb. 22, 2011

(54) MATRIX SYSTEM AND METHOD FOR DEBUGGING SCAN STRUCTURE

(75) Inventor: Mohammad Jahidur Rahman, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 228 days.

(21) Appl. No.: 12/249,317

(22) Filed: Oct. 10, 2008

(65) Prior Publication Data

US 2010/0095173 A1 Apr. 15, 2010

(51) Int. Cl.
*G01R 31/28* (2006.01)
(52) U.S. Cl. .................................... 714/729
(58) Field of Classification Search ................ 714/726, 714/729, 733
See application file for complete search history.

(56) References Cited

U.S. PATENT DOCUMENTS

| | | | |
|---|---|---|---|
| 6,861,867 B2* | 3/2005 | West et al. | 326/38 |
| 7,155,648 B2* | 12/2006 | Jas et al. | 714/726 |
| 7,665,001 B2* | 2/2010 | Baik et al. | 714/726 |
| 2006/0236179 A1* | 10/2006 | Ushikubo | 714/726 |
| 2008/0092002 A1* | 4/2008 | Shimooka | 714/731 |
| 2009/0089637 A1* | 4/2009 | Jun | 714/729 |
| 2010/0192030 A1* | 7/2010 | Kapur et al. | 714/726 |

* cited by examiner

*Primary Examiner*—James C Kerveros
(74) *Attorney, Agent, or Firm*—John R. Pessetto; W. James Brady; Frederick J. Telecky, Jr.

(57) ABSTRACT

An aspect of the present invention is drawn to a system that includes an automatic test engine, a decompressor, a first scan chain, a second scan chain, a compactor and a debug output. The automatic test engine is operable to output a test output, to receive a resultant input, to receive a debug input, to monitor the debug input and to compare the test output with the resultant input. The decompressor is arranged to receive a decompressor input based on the test output, to output a decompressor output. The scan chains are arranged to receive input based on the decompressor output, and each scan chain includes at least one flip-flop. The compactor is arranged to receive input based output from the flip-flops, and to output a compactor output. The debug output line is arranged to receive the flip-flop output.

20 Claims, 7 Drawing Sheets

MATRIX SYSTEM AND METHOD FOR DEBUGGING SCAN STRUCTURE

BACKGROUND

Faults in integrated circuits may occur during manufacture or use. Methods for testing may be designed into the integrated circuits to allow for fault detection. These methods are known as design-for-test (DFT). One method of DFT is known as the scan method.

A scan method of DFT is described with respect to FIG. 1. An integrated circuit 100 has an input 102, an output 104, an input determining portion 110, a logic portion 106, a flip-flop portion 108, an output determining portion 112, and a scan enable signal 114. During normal operation, data transmitted through input 102 is passed to the input determining portion 110, which sends the data to logic portion 106 and may pass the data to flip-flop portion 108. Logic portion 106 and flip-flop portion 108 modify the data and send the modified data to output determining portion 112, which uses the modified data to send output 104.

To use the scan method of DFT, the integrated circuit is put into a test mode. In the test mode, predetermined nodes within logic portion 106 are connected to inputs of respective flip-flops within flip-flop portion 108. The output of these predetermined nodes may then be pumped through flip-flop portion 108 and compared with expected values. If an error occurs, the flip-flop within flip-flop portion 108 having the error is identified. Thus, the node connected to the flip-flop having the error is identified as being a faulty node. As such, individual nodes within logic portion 106 may be tested. This test mode may be enabled by use of scan enable signal 114. During testing, known data is sent as input 102 to input determining portion 110. Input determining portion 110 receives input 102 and scan enable signal 114. Input 102 is sent by input determining portion 110 to logic portion 106 and flip-flop portion 108. Known data is stepped through and between logic portion 106 and flip-flop portion 108 and sent to output determining portion 112. Output determining portion 112 receives data from logic portion 106 and flip-flop portion 108 as well as scan enable signal 114 and uses the data to create a known output signal for output 104. The known output signal, which represents logic states of logic portion 106, can then be compared with expected logic states of logic portion 106 given the known input signal. If the data does not match, the chip is known to be faulty. When discussing "data" passed through logic portion 106 or flip-flop portion 108, what is really being passed are logic states of a binary 1 or a binary 0.

Flip-flop portion 108 may be a set of scan chains with one scan chain for each input as seen in FIG. 2. Integrated circuit 200 has inputs 202, flip-flop portion 204, and outputs 208. Flip-flop portion 204 contains scan chains 206, where each scan chain 206 is a series of flip-flops as shown in FIG. 3.

A scan chain 300, has input 304 and output 306. Internal to scan chain 300 is a series of flip-flops 302. There may be portions of logic or other circuitry between adjacent flip-flops 302 to allow for fault detection.

Returning to FIG. 2, during testing of integrated circuit 200, known inputs 202 are stepped through scan chains 206. Outputs 208 may be compared with the expected response to determine if there is a fault in integrated circuit 200.

As integrated circuits grow increasingly complex, internal scan chains grow longer as integrated circuits only have a certain number of inputs and outputs. Longer scan chains result in an increase of the time required for fault detection. One method of reducing the time for fault detection for long scan chains is shown in FIG. 4.

Integrated circuit 400 contains decompressor 404, flip-flop portion 406, and compactor 410. Scan chains 408 are represented in flip-flop portion 406. Scan channel inputs 402 are sent to decompressor 404. Decompressor 404 expands scan channel inputs to scan chains 408. The long scan chains of an integrated circuit similar to integrated circuit 200 of FIG. 2 are broken into many smaller chains allowing for a shorter testing time of integrated circuit 400. Compactor 410 compresses the outputs of scan chains 408 into scan channel outputs 412 in such a way that a fault in one of the scan chains 408 can be detected in the output. Scan channel outputs 412 can be compared to expected outputs to determine if there is a fault in integrated circuit 400. This will be briefly described with reference to FIG. 5 below.

FIG. 5 illustrates a conventional DFT system. In the figure, integrated circuit 400 of FIG. 4, is connected to an automatic test engine (ATE) 502. ATE 502 includes a compressed pattern generator 504 and a compressed expected response portion 506. Compressed pattern generator 504 is operable to generate compressed patterns of data to send through integrated circuit 400 via scan channel inputs 402. Compressed expected response portion 506 is operable to generate expected output data that integrated circuit 400 should output via scan channel outputs 412 based on the compressed patterns of data generated by compressed pattern generator 504, when integrated circuit 400 is operating correctly. Compressed expected response portion 506 is additionally operable to compare actual output data from integrated circuit 400 via scan channel outputs 412 with the expected output data and determine if there is an error in the actual output data. Unfortunately, with this system, if an error is detected by ATE 502, the portion of integrated circuit 400 that is faulty is hard to isolate, as will be discussed in greater detail below.

A simple compactor 600 that creates a single scan channel output 616 from four scan chains 602, 604, 606 and 608 is shown in FIG. 6. Compactor 600 includes XOR gates 610, 612 and 614. XOR gate 610 receives as inputs, the outputs of scan chains 602 and 604. XOR gate 612 receives as inputs, the outputs of scan chains 606 and 508. XOR gate 614 receives as inputs, the outputs of XOR gate 610 and XOR gate 612. XOR gate 614 creates scan channel output 616. If one of scan chains 602, 604, 606 or 608 has an error, the output of that scan chain to compactor 600 will be wrong and the error will carry through to output 616, so the fault may be detected. Unfortunately, though the fault may be detected, determining which scan chain has a fault may be difficult.

Presume, for example, that a faulty output develops somewhere in scan chain 606. The faulty output shifts through scan chain 606 until it is output to compactor 600. At this point, scan chains 602, 604 and 608 have output respective correct, expected values, whereas scan chain 606 has not. XOR gate 610 combines the outputs of scan chains 602 and 604 and therefore outputs the correct, expected value to XOR gate 614. XOR gate 612 combines the outputs of scan chains 606 and 608 to output to XOR gate 614, but because of the faulty output in scan chain 606, the output of XOR gate 612 is not the correct, expected value. XOR gate 614 combines the outputs of XOR gates 610 and 612 to output scan channel output 616. Because the output of XOR gate 612 is incorrect, scan channel output 616 is not the correct, expected value.

External to the device, only scan channel output 616 can be read. In the case of compactor 600, a faulty output in one of scan chains 602, 604, 606 and 608 would be indicated in scan channel output 616. However, there would be no indication in which scan chain the fault originated. Further, simultaneous faulty outputs in an even number of scan chains 602, 604, 606 and 608 may result in the faulty outputs canceling out in compactor 600 to be output as a seemingly correct output in scan channel output 616.

What is needed is a system and method to efficiently identify errors in scan chains.

BRIEF SUMMARY

It is an object of the present invention to provide a system and method that efficiently identifies errors in scan chains.

A system in accordance with an aspect of the present invention includes an automatic test engine, a decompressor, a first scan chain, a second scan chain, a compactor and a debug output line. The an automatic test engine is operable to output a test output, to receive a resultant input, to receive a debug input, to monitor the debug input and to compare the test output with the resultant input. The decompressor is arranged to receive a decompressor input based on the test output, to output a first decompressor output and to output a second decompressor output. The first scan chain is arranged to receive a first scan chain input based on the first decompressor output. The first scan chain includes a first flip-flop and a second flip-flop. The first flip-flop is arranged to receive a first flip-flop input based on the first scan chain input and to generate a first flip-flop output. The second flip-flop is arranged to receive a second flip-flop input based on the first flip-flop output and to generate a second flip-flop output. The second scan chain is arranged to receive a second scan chain input based on the second decompressor output. The second scan chain includes a third flip-flop and a fourth flip-flop. The third flip-flop is arranged to receive a third flip-flop input based on the second scan chain input and to generate a third flip-flop output. The fourth flip-flop is arranged to receive a fourth flip-flop input based on the third flip-flop output and to generate a fourth flip-flop output. The compactor is arranged to receive a first compactor input based on second flip-flop output, to receive a second compactor input based on the fourth flip-flop output and to output a compactor output. The debug output line is arranged to receive the second flip-flop output. The resultant input is based on the compactor output. The second flip-flop is arranged to additionally receive the fourth flip-flop output.

Additional advantages and novel features of the invention are set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

BRIEF SUMMARY OF THE DRAWINGS

The accompanying drawings, which are incorporated in and form a part of the specification, illustrate an exemplary embodiment of the present invention and, together with the description, serve to explain the principles of the invention. In the drawings.

DETAILED DESCRIPTION

Several exemplary integrated circuits in accordance with the present invention, including methods for fault detection in an exemplary design-for-test integrated circuits, will be described with respect to FIG. 7-11.

A first aspect of the present invention will now be described with reference to FIG. 7, wherein a single debug output may be used to quickly identify a faulty scan chain.

Figure 7:
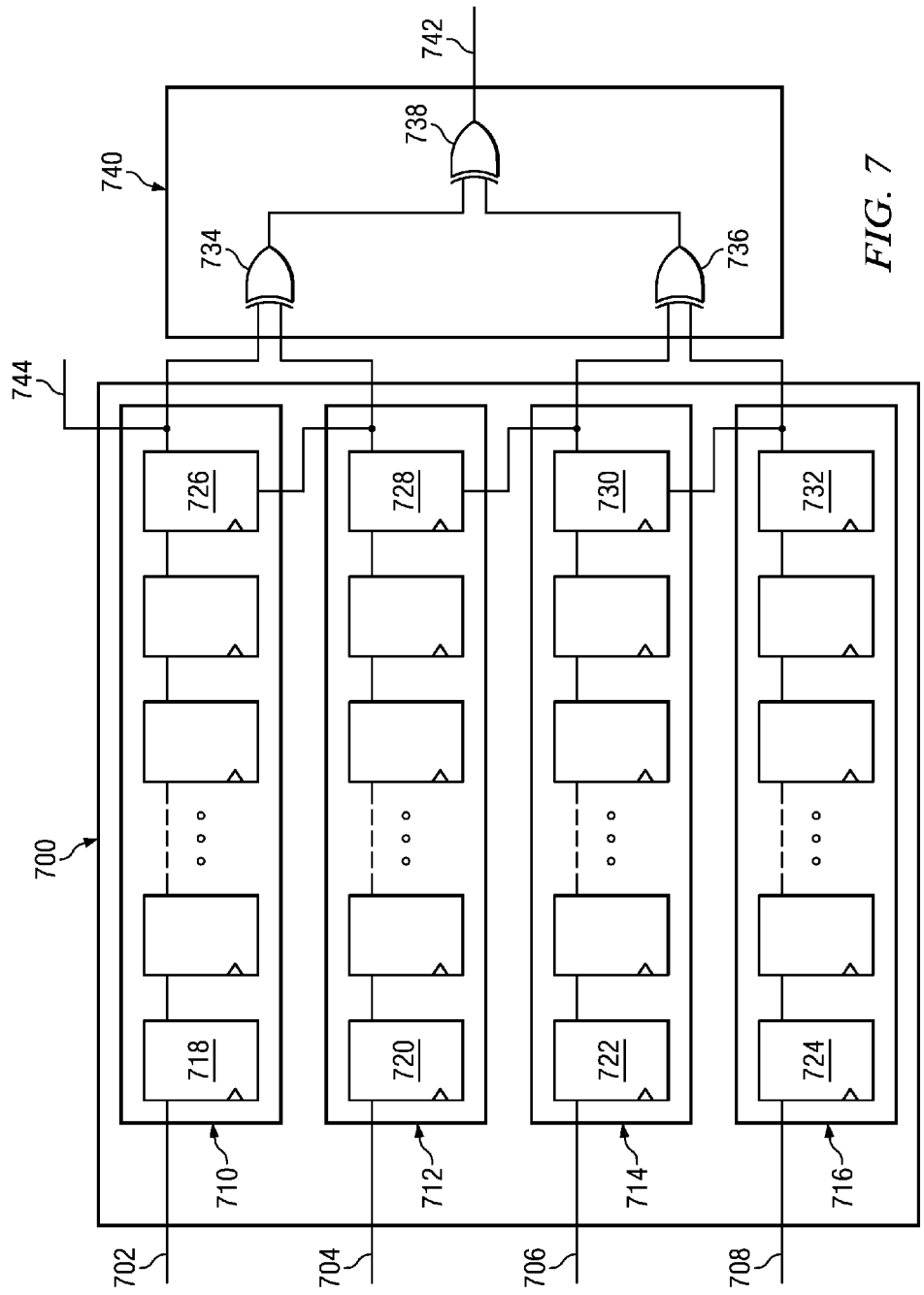
FIG. 7 illustrates a design-for-test scan method in accordance with an example aspect of the present invention.

FIG. 7 illustrates a portion of an exemplary design-for-test system representing a flip-flop portion 700 and a compactor 740. Flip-flop portion 700 has scan chains 710, 712, 714 and 716. Each scan chain 710, 712, 714 and 716 includes respective initial flip-flops 718, 720, 722 and 724 and respective ending flip-flops 726, 728, 730 and 732. Scan chain 710 receives scan chain input 702, which is then passed from flip-flop 718, through a plurality of flip-flops and to flip-flop 726. Scan chain 712 receives scan chain input 704, which is then passed from flip-flop 720, through a plurality of flip-flops and to flip-flop 728. Scan chain 714 receives scan chain input 706, which is then passed from flip-flop 722, through a plurality of flip-flops and to flip-flop 730. Scan chain 716 receives scan chain input 708, which is then passed from flip-flop 724, through a plurality of flip-flops and to flip-flop 732.

During testing of flip-flop portion 700 and compactor 740, the testing process runs in a first mode until a fault is detected. In this first mode, flip-flop 726 of scan chain 710 outputs to XOR gate 734 of compactor 740; flip-flop 728 of scan chain 712 outputs to XOR gate 734 of compactor 740; flip-flop 730 of scan chain 714 outputs to XOR gate 736 of compactor 740 and flip-flop 732 of scan chain 716 outputs to XOR gate 736 of compactor 740. XOR gate 734 and XOR gate 736 Output to XOR gate 738, which produces scan out 742, which can be used for fault detection.

Once a fault is detected, the integrated circuit switches to the second mode, a vertically pumping mode. In this mode, the states of flip-flops 726, 728, 730 and 732 are vertically pumped to pinpoint the error in the system, as described in more detail below.

With respect to vertically pumping data from flip-flops, presume that at time $t_0$ at which the last data that is output to XOR 734 and XOR 736 additionally remains in tile last flip-flops, wherein flip-flop 726 has data $d_1$ latched therein, flip-flop 728 has data $d_2$ latched therein, flip-flop 730 has data $d_3$ latched therein and flip-flop 732 has data $d_4$ latched therein. In this mode, at time $t_1$, data $d_1$ is outputted from flip-flop 726 to a debug output 744, data $d_2$ is outputted from flip-flop 728 to the input of flip-flop 726, data $d_3$ is outputted from flip-flop 730 to the input of flip-flop 728 and data $d_4$ is outputted from flip-flop 732 to the input of flip-flop 730. At time $t_2$, data $d_2$ is outputted from flip-flop 726 to debug output 744, data $d_3$ is outputted from flip-flop 728 to the input of flip-flop 726 and data $d_4$ is outputted from flip-flop 730 to the input of flip-flop 728. At time $t_3$, data $d_3$ is outputted from flip-flop 726 to debug output 744 and data $d_4$ is outputted from flip-flop 728 to the input of flip-flop 726. Finally, at time $t_4$, data $d_4$ is outputted from flip-flop 726 to debug output 744. Accordingly, from time $t_1$ through time $t_4$, the data latched within each flip-flop 726, 728, 730 and 732 at time to has been serially output as $d_1$ $d_2$ $d_3$ $d_4$ to debug output 744.

An external test system may then check $d_1$ $d_2$ $d_3$ $d_4$ from debug output 744 against expected output data to quickly determine which data is incorrect. Once the incorrect data is determined, the scan chain having the error therein will is easily identified.

An example of a testing process in accordance with an example embodiment described above, will now be discussed with further reference to FIG. 8.

Figure 8:
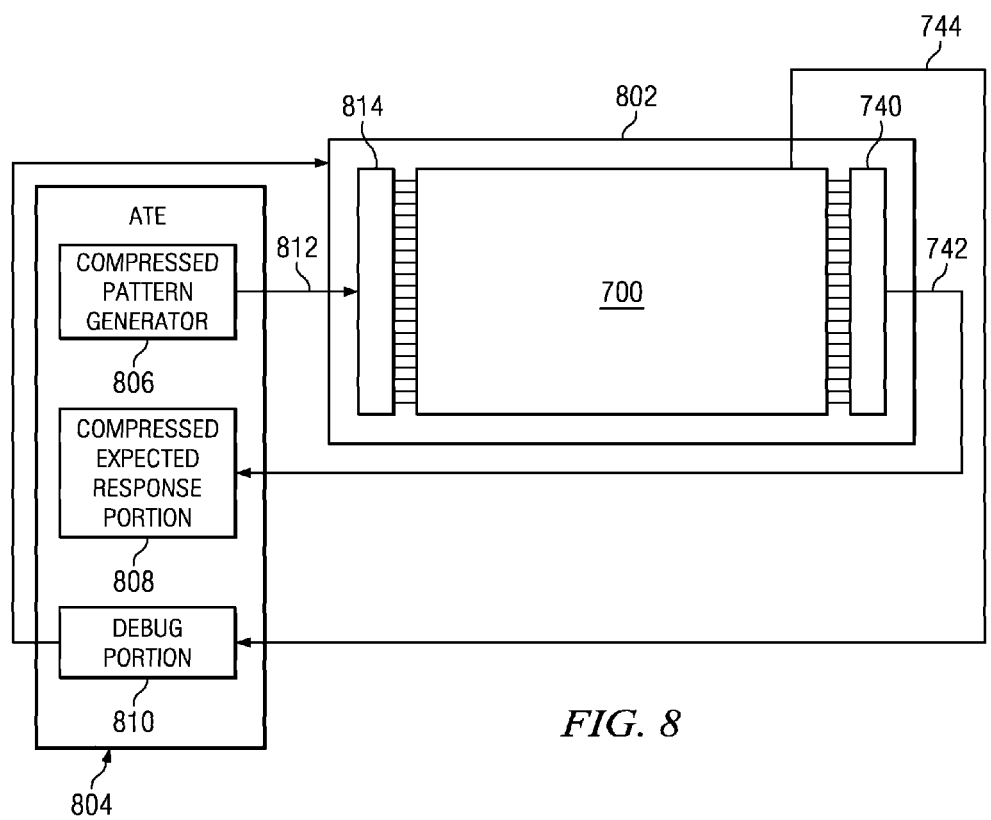
FIG. 8 illustrates an example design for test system in accordance with an aspect of the present invention.

FIG. 8 illustrates a DFT system in accordance with an aspect of the present invention. In the figure, an integrated circuit 802 is connected to an automatic test engine (ATE) 804. Integrated circuit 802 includes a decompressor 814, flop portion 700 and a compactor 740 of FIG. 7. ATE 804 includes a compressed pattern generator 806, a compressed expected response portion 808 and a debug portion 810. Compressed pattern generator 806 is operable to generate compressed patterns of data to send through integrated circuit 802 via scan channel input 812. Compressed expected response portion 808 is operable to generate expected output data that integrated circuit 802 should output via scan channel output 742 based on the compressed patterns of data generated by compressed pattern generator 806, when integrated circuit 802 is operating correctly. Compressed expected response portion 808 is additionally operable to compare actual output data from integrated circuit 802 via scan channel output 742 with the expected output data and determine if there is an error in the actual output data. If an error is detected, debug portion 810 is operable to instruct integrated circuit 802 to vertically pump data to output 744 to determine which flip-flop is creating the error.

Presume that an intended output of scan chain 710 is a binary 1, an intended output of scan chain 712 is a binary 0, an intended output of scan chain 714 is a binary 0 and an intended output of scan chain 716 is a binary 1. In such a case, XOR gate 734 should output a binary 1 and XOR gate 736 should output a binary 1. In such a case, output 742 should be a binary 0. Say that the output as tested from output 742 is a binary 1. In such a case an error is evident, but in which scan chain?

By switching to a vertical pumping scheme, the data from each of flip-flops 726, 728, 730 and 732 are serially pumped out debug output 744 as discussed above. Presume, in the present example, that a binary data 1 from flip-flop 726, a binary 0 from flip-flop 728, a binary 1 from flip-flop 730 and a binary 1 from flip-flop 732 are outputted to debug output 744 as serial binary data 1011. In this example, the intended output of 1001 may be quickly compared with the actual output 1011, to determine that the third bit is incorrect. As such, it is quickly determined that flip-flop 730 had an incorrect output. Therefore, it is quickly determined that scan chain 714 produced the error.

A second aspect of the present invention will now be described with reference to FIG. 9, wherein a plurality of debug outputs may be used to quickly identify a faulty flip-flop from within a plurality of scan chains.

Figure 9:
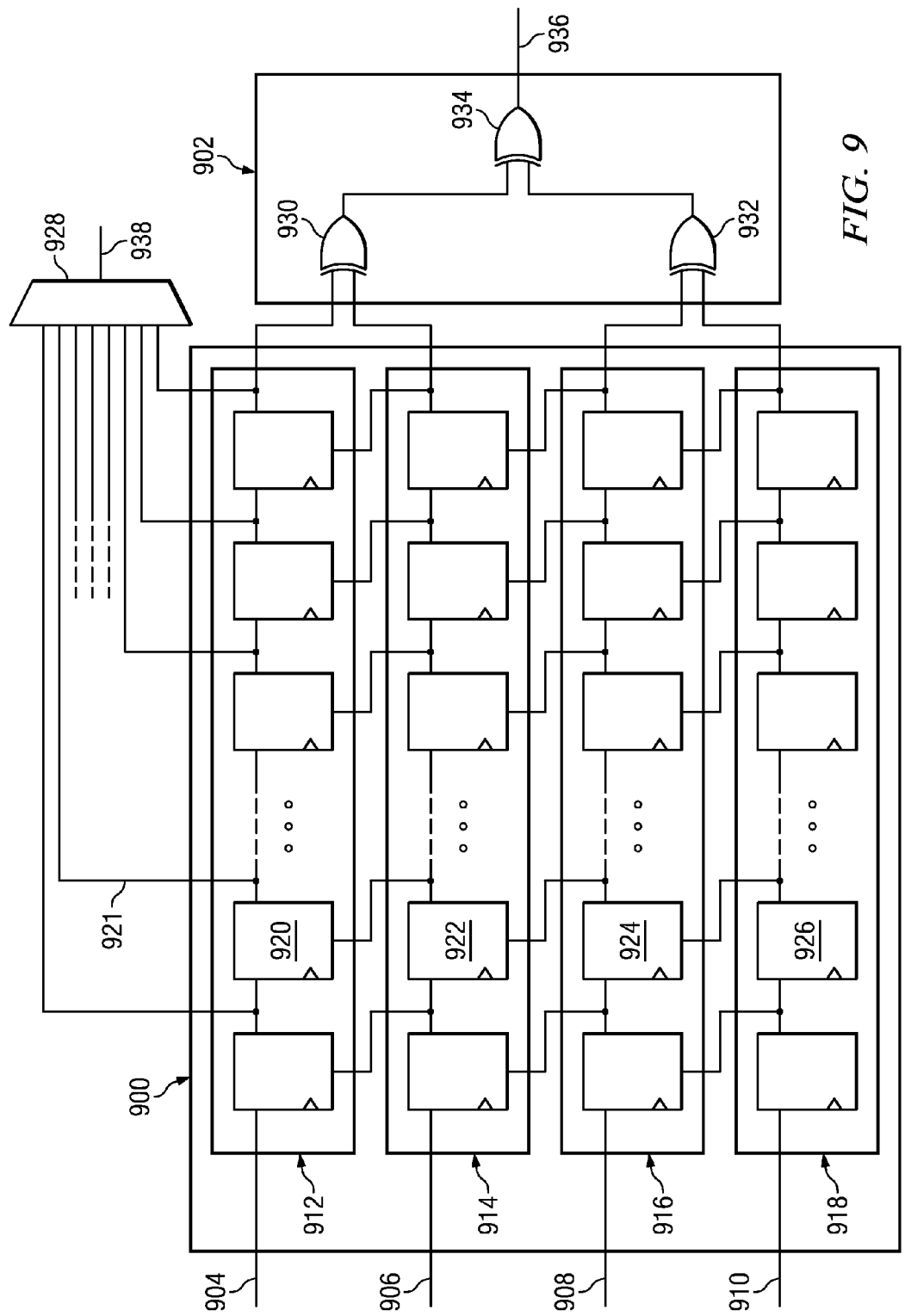
FIG. 9 illustrates a design-for-test scan method in accordance with another example aspect of the present invention.

FIG. 9 illustrates a portion of an exemplary design-for-test system representing flip-flop portion 900 and compactor 902. Flip-flop portion 900 includes scan chains 912, 914, 916 and 918. Each scan chain 912, 914, 916 and 918 includes a respective initial flip-flop and a respective ending flip-flop. Scan chain 912 receives scan chain input 904, which is then passed from an initial flip-flop, to a second flip-flop 920 and then through a remaining plurality of flip-flops. Scan chain 914 receives scan chain input 906, which is then passed from an initial flip-flop, to a second flip-flop 922 and then through a remaining plurality of flip-flops. Scan chain 916 receives scan chain input 908, which is then passed from an initial flip-flop, to a second flip-flop 924 and then through a remaining plurality of flip-flops. Scan chain 918 receives scan chain input 910, which is then passed from an initial flip-flop, to a second flip-flop 926 and then through a remaining plurality of flip-flops.

During testing of the integrated circuit containing flip-flop portion 900 and compactor 902, the testing process runs in a first mode until a fault is detected. In this first mode, scan chain 912 outputs to XOR gate 930 of compactor 902; scan chain 914 outputs to XOR gate 930 of compactor 902; scan chain 916 outputs to XOR gate 932 of compactor 902 and scan chain 918 outputs to XOR gate 932 of compactor 902. XOR gate 930 and XOR gate 932 output to XOR gate 943, which produces scan out 936, which can be used for fault detection.

Once a fault is detected, the circuit switches to the second mode, a vertically pumping mode. In this mode, the states of flip-flops are vertically pumped to pinpoint the error in the system, as described in more detail below.

With respect to vertically pumping data from flip-flops, each column of flip-flops is vertically pumped in a manner similar to that discussed above with respect to FIG. 7. For the sake of brevity, vertical pumping of the column that includes flip-flops 920, 922, 924 and 926, will now be described.

Presume that at time $t_0$ at which the last data that is output to XOR 930 and XOR 932 additionally remains in the last flip-flops, wherein the last flip-flop in scan chain 912 has data $d_{x1}$ latched therein, the last flip-flop in scan chain 914 has data $d_{x2}$ latched therein, the last flip-flop in scan chain 916 has data $d_{x3}$ latched therein and the last flip-flop in scan chain 918 has data $d_{x4}$ latched therein. Further, presume that at time $t_0$, flip-flop 920 has data $d_{21}$ latched therein, flip-flop 922 has data $d_{22}$ latched therein, flip-flop 924 has data $d_{23}$ latched therein and flip-flop 920 has data $d_{24}$ latched therein.

In this mode, at time $t_1$, data $d_{21}$ is outputted from flip-flop 920 to a debug output 921, data $d_{22}$ is outputted from flip-flop 922 to the input of flip-flop 920, data $d_{23}$ is outputted from flip-flop 924 to the input of flip-flop 922 and data $d_{24}$ is outputted from flip-flop 926 to the input of flip-flop 924. At time $t_2$, data $d_{22}$ is outputted from flip-flop 920 to debug output 921, data $d_{23}$ is outputted from flip-flop 922 to the input of flip-flop 920 and data $d_{24}$ is outputted from flip-flop 924 to the input of flip-flop 922. At time $t_3$, data $d_{23}$ is outputted from flip-flop 920 to debug output 921 and data $d_{24}$ is outputted from flip-flop 922 to the input of flip-flop 920. Finally, at time $t_{24}$, data $d2_4$ is outputted from flip-flop 920 to debug output 921. Accordingly, from time $t_1$ through time $t_4$, the data latched within each flip-flop 920, 922, 924 and 926 at time to has been serially output as $d_{21}$ $d_{22}$ $d_{23}$ $d_{24}$ to debug output 921.

As discussed above, in accordance with this aspect of the present invention, the column of flip-flops 920, 922, 924 and 926 has a debug output 921 corresponding thereto. Every other column of flip-flops will additionally have a corresponding debug output, wherein the plurality of debug outputs is input into a multiplexer 928. Multiplexer 928 may be controlled to output any one of the plurality of debug outputs as an output 938 to quickly identify a faulty flip-flop.

An external test system may then check data from output 938 against expected output data to quickly determine which data is incorrect. Once the incorrect data is determined, the column of flip-flops having the error therein will easily be identified. Once the column having the error is identified, the specific flip-flop having the error therein will is easily identified.

An example of a testing process in accordance with an example embodiment described above, will now be discussed. For the sake of brevity, a state in which multiplexer 928 is set such that debug output 921 is tested, which corresponds to the column that includes flip-flops 920, 922, 924 and 926, will now be described.

Figure 10:
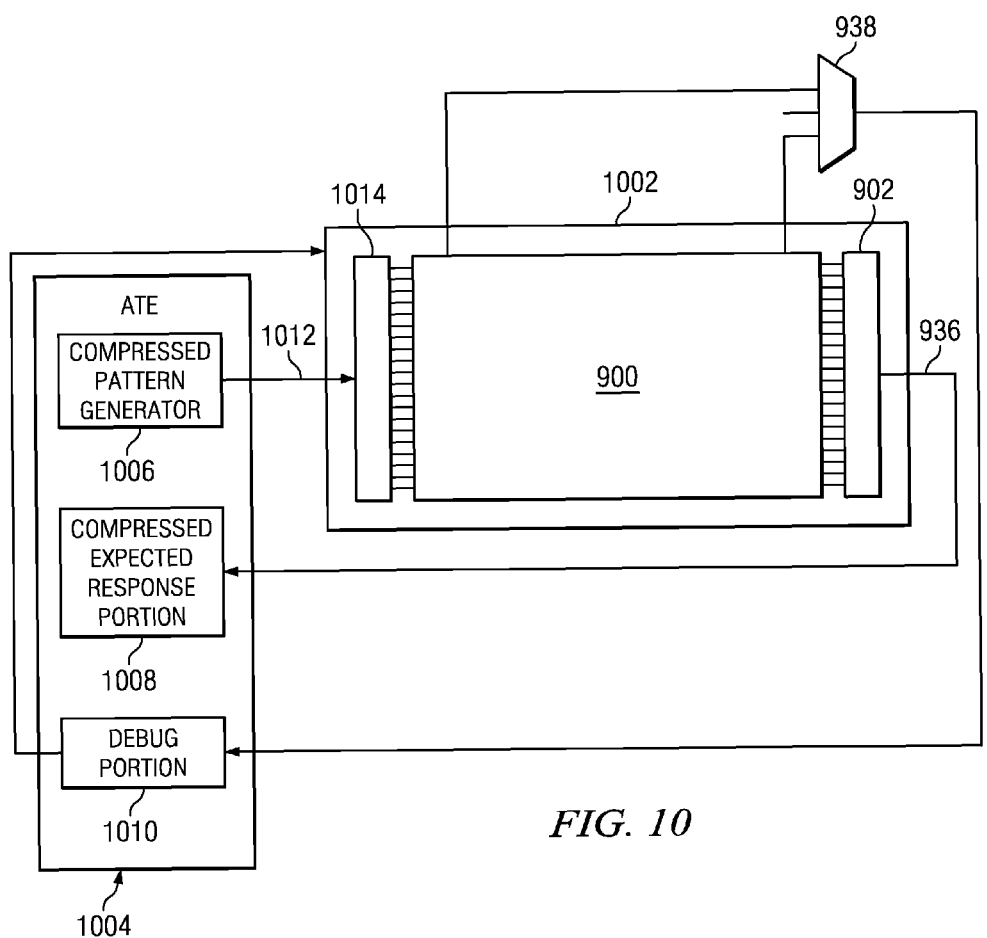
FIG. 10 illustrates another example design for test system in accordance with another aspect of the present invention.

FIG. 10 illustrates a DFT system in accordance with another aspect of the present invention. In the figure, an integrated circuit 1002 is connected to an automatic test engine (ATE) 1004. Integrated circuit 1002 includes a decompressor 1014, flop portion 900, compactor 902 and multiplexer 938 of FIG. 9. ATE 1004 includes a compressed pattern generator 1006, a compressed expected response portion 1008 and a debug portion 1010. Compressed pattern generator 1006 is operable to generate compressed patterns of data to send through integrated circuit 1002 via scan channel input 1012. Compressed expected response portion 1010 is operable to generate expected output data that integrated circuit 1002 should output via scan channel output 936 based on the compressed patterns of data generated by compressed pattern generator 1006, when integrated circuit 1002 is operating correctly. Compressed expected response portion 1010 is additionally operable to compare actual output data from integrated circuit 1002 via scan channel output 936 with the expected output data and determine if there is an error in the actual output data. If an error is detected, debug portion 1010 is operable to instruct integrated circuit 1002 to vertically pump data to multiplexer 938 and control multiplexer 938 to output 744 to determine which flip-flop is creating the error.

Presume that in a state, wherein an intended output of scan chain 912 is a binary 1, an intended output of scan chain 914 is a binary 0, an intended output of scan chain 916 is a binary 0 and an intended output of scan chain 918 is a binary 1, an intended output of flip-flop 920 is a binary 0, an intended output of flip-flop 922 is a binary 0, an intended output of flip-flop 924 is a binary 0 and an intended output of flip-flop 926 is a binary 0. In such a case, XOR gate 930 should output a binary 1 and XOR gate 932 should output a binary 1. In such a case, output 936 should be a binary 0. Say that the output as tested from output 936 is a binary 1. In such a case an error is evident, but in which flip-flop?

By switching to a vertical pumping scheme, the data from each of column of flip-flops are serially pumped out debug outputs as discussed above. Presume, in the present example, that an intended output corresponding to the first column of flip-flops coincides with actual data as read from the corresponding debug output and produced by multiplexer 928. Multiplexer 928 may then output debug output 921 as output 938 for testing. Now, presume that a binary data 0 from flip-flop 920, a binary 0 from flip-flop 922, a binary 1 from flip-flop 924 and a binary 0 from flip-flop 926 are outputted to debug output 921 as serial binary data 0010. In this example, the intended output of 0000 may be quickly compared with the actual output 0010, to determine that the third bit is incorrect. As such, it is quickly determined that flip-flop 924 had an incorrect output. Therefore, it is quickly determined that flip-flop 924 produced the error.

An example system and method of data shifting between flip-flops will be described with reference to FIG. 11.

Figure 11:
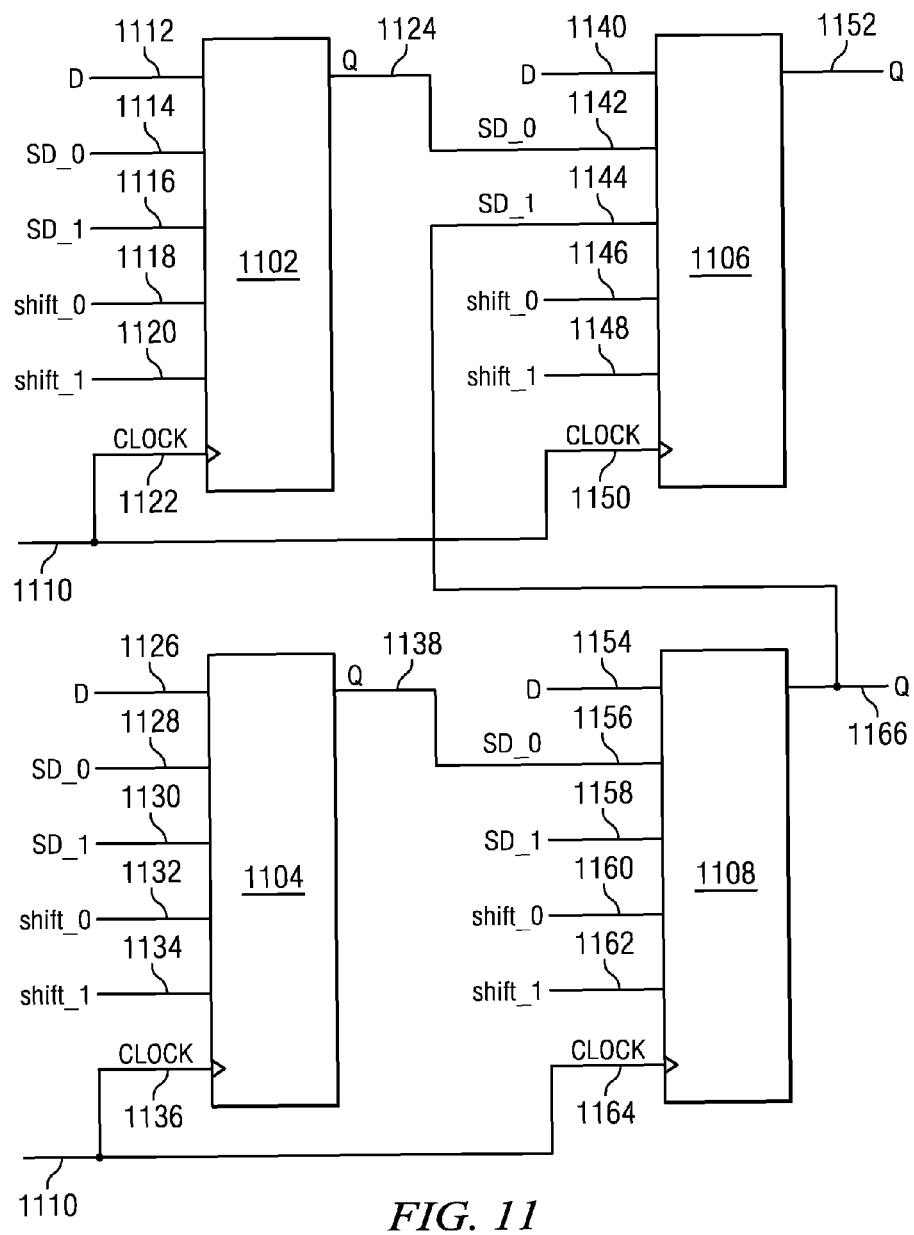
FIG. 11 illustrates a detailed view of a design-for-test scan method in accordance with an example aspect of the present invention.

FIG. 11 illustrates the last two flip-flops in two scan chains, prior to a compactor (not shown) of a flip-flop portion of a DFT circuit. A first scan chain includes a flip-flop 1102 and a flip-flop 1106, whereas a second scan chain includes a flip-flop 1104 and a flip-flop 1108.

Each of flip-flop 1102, flip-flop 1104, flip-flop 1106 and flip-flop 1108 has a data input 1112, a data input 1126, a data input 1140 and a data input 1154, respectively.

Each of flip-flop 1102, flip-flop 1104, flip-flop 1106 and flip-flop 1108 has a first shift data input 1114, a first shift data input 1128, a first shift data input 1142 and a first shift data input 1156, respectively.

Each of flip-flop 1102, flip-flop 1104, flip-flop 1106 and flip-flop 1108 has a second shift data input 1116, a second shift data input 1130, a second shift data input 1144 and a second shift data input 1158, respectively.

Each of flip-flop 1102, flip-flop 1104, flip-flop 1106 and flip-flop 1108 has a first shift enable input 1118, a first shift enable input 1132, a first shift enable input 1146 and a first shift enable input 1160, respectively.

Each of flip-flop 1102, flip-flop 1104, flip-flop 1106 and flip-flop 1108 has a second shift enable input 1120, a second shift enable input 1134, a second shift enable input 1148 and a second shift enable input 1162, respectively.

Each of flip-flop 1102, flip-flop 1104, flip-flop 1106 and flip-flop 1108 has a clock input 1122, a clock input 1136, a clock input 1150 and a clock input 1164, respectively. A clock signal 1110 connects to clock inputs 1122, 1136, 1150 and 1164 to command flip-flops 1102, 1104, 1106 and 1108 to latch. Accordingly, each of flip-flop 1102, flip-flop 1104, flip-flop 1106 and flip-flop 1108 will latch at each edge of clock signal 1110. In some embodiments, a rising edge of clock signal 1110 may latch flip-flops 1102, 1104, 1106 and 1108. In other embodiments, a falling edge of clock signal 1110 may latch flip-flops 1102, 1104, 1106 and 1108.

Each of flip-flop 1102, flip-flop 1104, flip-flop 1106 and flip-flop 1108 has an output 1124, an output 1138, an output 1152 and an output 1166, respectively.

Output 1124 of flip-flop 1102 is connected to first shift input 1142 of flip-flop 1106. Output 1138 of flip-flop 1104 is connected to first shift input 1156 of flip-flop 1108. Output 1152 of flip-flop 1106 and output 1166 of flip-flop 1108 may connect to a compactor, not shown. Output 1166 of flip-flop 1108 is additionally connected to second shift input 1144 of flip-flop 1106.

In a first shift mode, a horizontal shift mode, data shifts horizontally from left to right through flip-flops 1102, 1104, 1106 and 1108. In this mode, first shift enable inputs 1118, 1132, 1146 and 1160 are activated while second shift enable inputs 1120, 1134, 1148 and 1162 are deactivated. On pulses of clock signal 1110, flip-flops 1102, 1104, 1106 and 1108 update with data from first shift enable inputs 1114, 1128, 1142 and 1156 respectively. Data from flip-flop 1102 is output 1124 to first shift enable input 1142 of flip-flop 1106 and data from flip-flop 1104 is output 1138 to first shift enable input 1156 of flip-flop 1108. As long as first shift enable inputs 1118, 1132, 1146 and 1160 are activated and second shift enable inputs 1120, 1134, 1148 and 1162 are deactivated, data continues to shift horizontally from left to right through the device.

Figure 1:
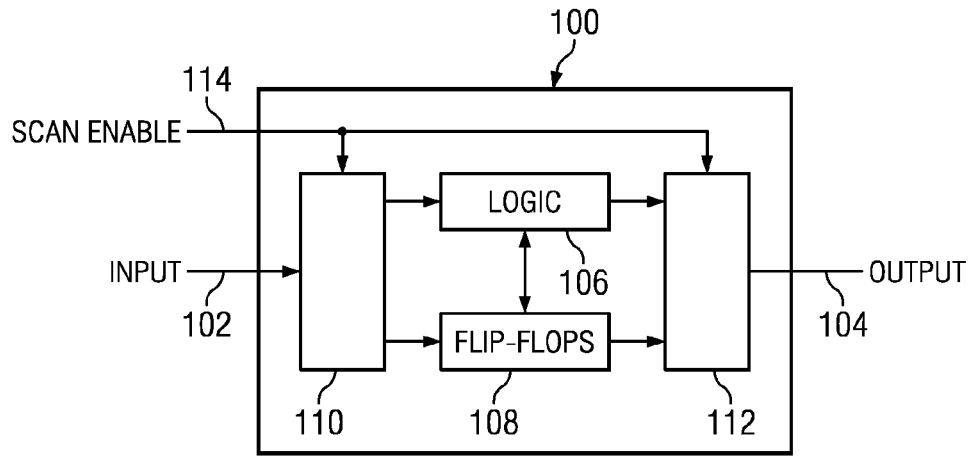
FIG. 1 illustrates an integrated circuit incorporating a design-for-test scan method.
Figure 2:
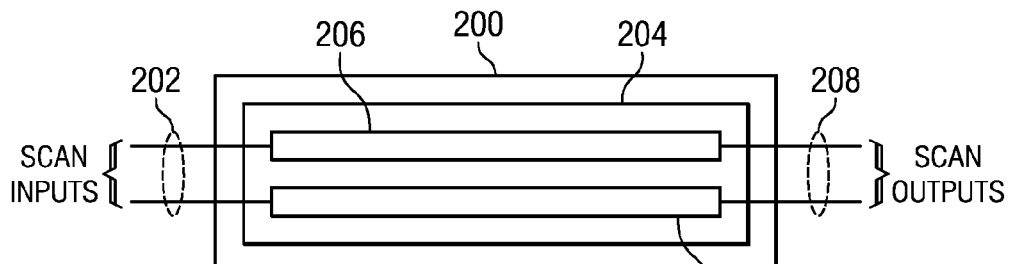
FIG. 2 illustrates a flip-flop portion of a design-for-test scan method.
Figure 3:
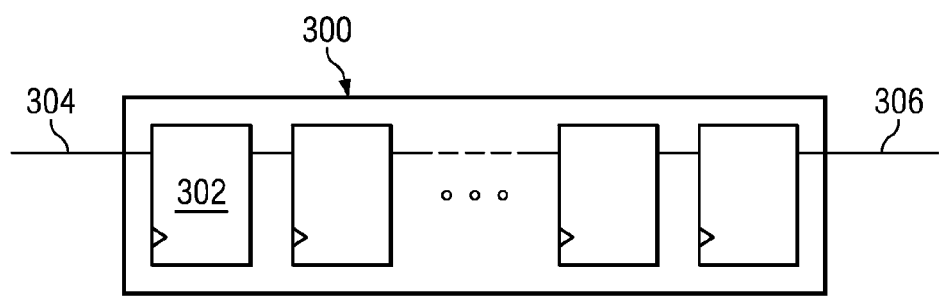
FIG. 3 illustrates a detailed view of a scan chain.
Figure 4:
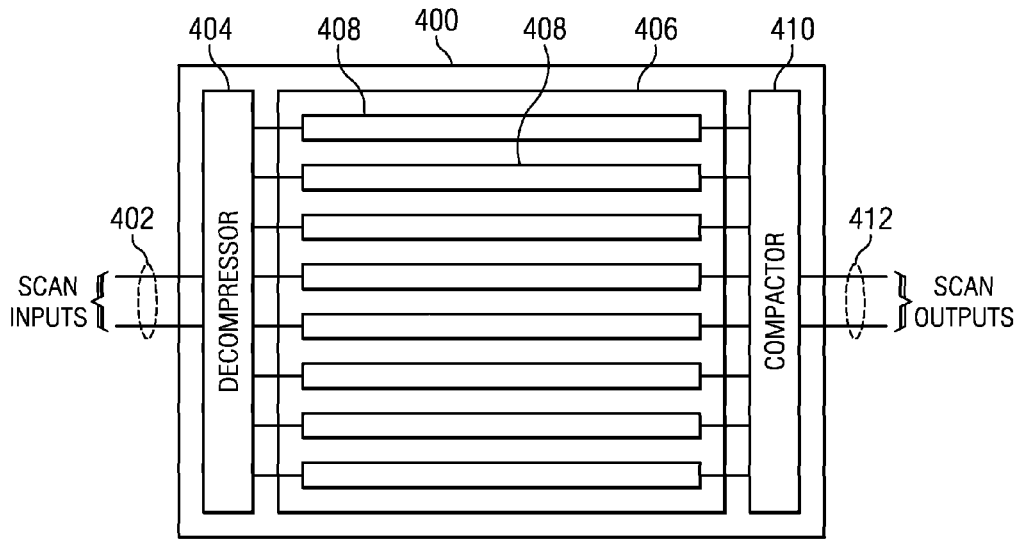
FIG. 4 illustrates an integrated circuit implementing a scan method of design-for-test with virtual scan chains.
Figure 5:
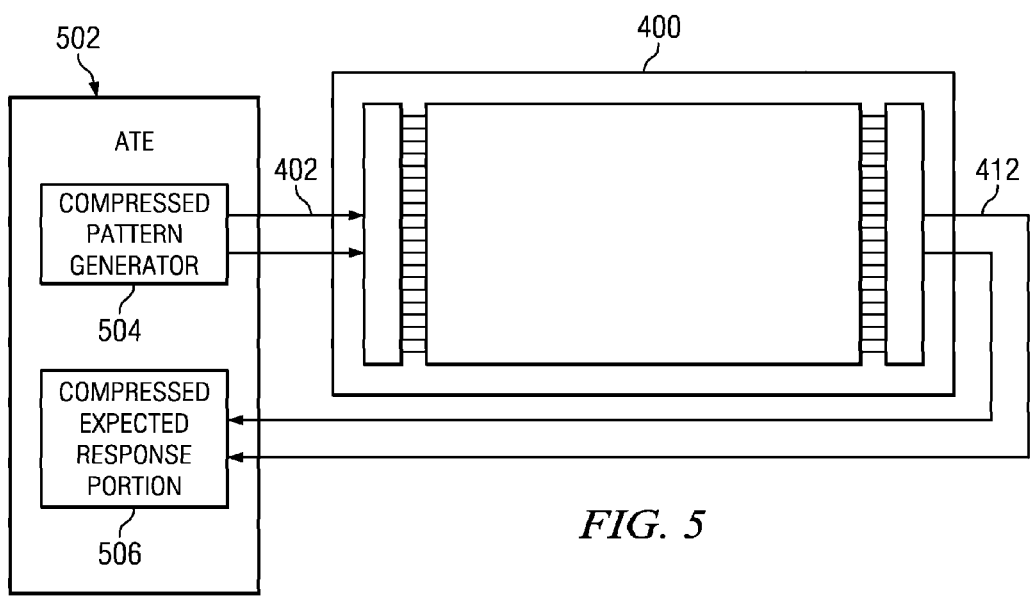
FIG. 5 illustrates a conventional design for test system.
Figure 6:
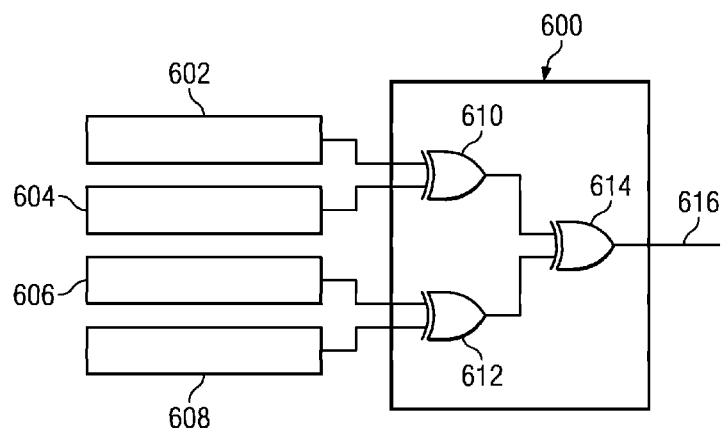
FIG. 6 illustrates an exemplary compactor.

In a second shift mode, a vertical shift mode, data shifts vertically through flip-flops 1106 and 1108. This mode is generally described above with respect to FIG. 6. In this mode, second shift enable inputs 1120, 1134, 1148 and 1162 are activated while first shift enable inputs 1118, 1132, 1146 and 1160 are deactivated. On pulses of clock signal 1110, flip-flops 1102, 1104, 1106 and 1108 update with data from second shift enable inputs 1116, 1130, 1144 and 1158 respectively. Data from flip-flop 1108 is output 1166 to second shift enable input 1144 of flip-flop 1106. As long as second shift enable inputs 1120, 1134, 1148 and 1162 are activated and first shift enable inputs 1118, 1132, 1146 and 1160 are deactivated, data continues to shift up through the device.

Referring back to FIG. 7, scan chains 710, 712, 714 and 716 may be tested by horizontally shifting data from left to right through the respective flip-flops using first shift enable inputs. When an error is determined from output 742, the device may be switched to the vertically shifting mode using second shift enable inputs. Once in the vertically shifting mode, the data from each flip-flop 726, 728, 730 and 732 may be pumped out and compared with an expected data output determine which flip-flop is faulty.

Flip-flops 1106 and 1108 of FIG. 11 show interconnected flip-flops similar to the flip-flops the embodiment described in FIG. 7. Similarly, flip-flop 1104 may be interconnected to flip-flop 1104 to further explain an operation of the more general embodiment discussed above with respect to FIG. 9. By connecting output 1138 of flip-flop 1104 to second shift data input 1116 of flip-flop 1102, data may shift vertically from flip-flop 1104 to flip-flop 1102 in the same manner data shifts from flip-flop 1108 to flip-flop 1106, as described above.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The exemplary embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A system comprising:
   an automatic test engine operable to output a test output, to receive a resultant input, to receive a debug input, to monitor the debug input and to compare the test output with the resultant input;
   a decompressor arranged to receive a decompressor input based on the test output, to output a first decompressor output and to output a second decompressor output;
   a first scan chain arranged to receive a first scan chain input based on the first decompressor output, said first scan chain comprising a first flip-flop and a second flip-flop, said first flip-flop being arranged to receive a first flip-flop input based on the first scan chain input and to generate a first flip-flop output, said second flip-flop being arranged to receive a second flip-flop input based on the first flip-flop output and to generate a second flip-flop output;
   a second scan chain arranged to receive a second scan chain input based on the second decompressor output, said second scan chain comprising a third flip-flop and a fourth flip-flop, said third flip-flop being arranged to receive a third flip-flop input based on the second scan chain input and to generate a third flip-flop output, said fourth flip-flop being arranged to receive a fourth flip-flop input based on the third flip-flop output and to generate a fourth flip-flop output;
   a compactor arranged to receive a first compactor input based on second flip-flop output, to receive a second compactor input based on the fourth flip-flop output and to output a compactor output; and
   a debug output line arranged to receive the second flip-flop output,
   wherein the resultant input is based on the compactor output, and
   wherein said second flip-flop is arranged to additionally receive the fourth flip-flop output.

2. The system of claim 1, wherein the debug input is based on the second flip-flop output.

3. The system of claim 2, further comprising:
   a clock signal line operable to provide a clock signal having a first pulse and a second pulse to said first flip-flop, said second flip-flop, said third flip-flop and said fourth flip-flop,
   wherein, on the first clock pulse, said second flip-flop is operable to output the second flip-flop output to said debug output line and said fourth flip-flop is operable to output the fourth flip-flop output to said second flip-flop, and
   wherein, on the second clock pulse, said second flip-flop is operable to output the fourth flip-flop output to said debug output line.

4. The system of claim 2, further comprising:
   a clock signal line operable to provide a clock signal having a first pulse and a second pulse to said first flip-flop, said second flip-flop, said third flip-flop and said fourth flip-flop,
   wherein, on the first clock pulse, said second flip-flop is operable to output the second flip-flop output to said compactor and said first flip-flop is operable to output the first flip-flop output to said second flip-flop, and
   wherein, on the second clock pulse, said second flip-flop is operable to output the first flip-flop output to said compactor.

5. The system of claim 1, further comprising:
   a second debug output line arranged to receive first flip-flop output; and
   a multiplexer arranged to receive the second flip-flop output from said debug output line, to receive the first flip-flop output from said second debug output line and to output one of the second flip-flop output and the first flip-flop output,
   wherein said first flip-flop is arranged to additionally receive the third flip-flop output.

6. The system of claim 5, further comprising:
   a clock signal line operable to provide a clock signal having a first pulse and a second pulse to said first flip-flop, said second flip-flop, said third flip-flop and said fourth flip-flop,
   wherein, on the first clock pulse, said second flip-flop is operable to output the second flip-flop output to said debug output line and said fourth flip-flop is operable to output the fourth flip-flop output to said second flip-flop,
   wherein, on the first clock pulse, first second flip-flop is operable to output the first flip-flop output to said second debug output line and said third flip-flop is operable to output the third flip-flop output to said first flip-flop,
   wherein, on the second clock pulse, said second flip-flop is operable to output the fourth flip-flop output to said debug output line, and
   wherein, on the second clock pulse, said first flip-flop is operable to output the third flip-flop output to said second debug output line.

7. The system of claim 5, further comprising:
   a clock signal line operable to provide a clock signal having a first pulse and a second pulse to said first flip-flop, said second flip-flop, said third flip-flop and said fourth flip-flop, wherein, on the first clock pulse, said second flip-flop is operable to output the second flip-flop output to said compactor and said first flip-flop is operable to output the first flip-flop output to said second flip-flop, wherein, on the first clock pulse, said fourth flip-flop is operable to output the fourth flip-flop output to said compactor and said third flip-flop is operable to output the third flip-flop output to said fourth flip-flop, wherein, on the second clock pulse, said second flip-flop is operable to output the first flip-flop output to said compactor, and wherein, on the second clock pulse, said fourth flip-flop is operable to output the third flip-flop output to said compactor.

8. The system of claim 5, wherein the debug input is based on the outputted one of the second flip-flop output and the first flip-flop output.

9. A device for use with an automatic test engine operable to output a test output, to receive a resultant input, to receive a debug input, to monitor the debug input and to compare the test output with the resultant input, said device comprising:
a decompressor arranged to receive a decompressor input based on the test output, to output a first decompressor output and to output a second decompressor output;
a first scan chain arranged to receive a first scan chain input based on the first decompressor output, said first scan chain comprising a first flip-flop and a second flip-flop, said first flip-flop being arranged to receive a first flip-flop input based on the first scan chain input and to generate a first flip-flop output, said second flip-flop being arranged to receive a second flip-flop input based on the first flip-flop output and to generate a second flip-flop output;
a second scan chain arranged to receive a second scan chain input based on the second decompressor output, said second scan chain comprising a third flip-flop and a fourth flip-flop, said third flip-flop being arranged to receive a third flip-flop input based on the second scan chain input and to generate a third flip-flop output, said fourth flip-flop being arranged to receive a fourth flip-flop input based on the third flip-flop output and to generate a fourth flip-flop output;
a compactor arranged to receive a first compactor input based on second flip-flop output, to receive a second compactor input based on the fourth flip-flop output and to output a compactor output; and
a debug output line arranged to receive the second flip-flop output,
wherein the resultant input is based on the compactor output, and
wherein said second flip-flop is arranged to additionally receive the fourth flip-flop output.

10. The device of claim 9, wherein the debug input is based on the second flip-flop output.

11. The device of claim 10, further comprising:
a clock signal line operable to provide a clock signal having a first pulse and a second pulse to said first flip-flop, said second flip-flop, said third flip-flop and said fourth flip-flop,
wherein, on the first clock pulse, said second flip-flop is operable to output the second flip-flop output to said debug output line and said fourth flip-flop is operable to output the fourth flip-flop output to said second flip-flop, and
wherein, on the second clock pulse, said second flip-flop is operable to output the fourth flip-flop output to said debug output line.

12. The device of claim 10, further comprising:
a clock signal line operable to provide a clock signal having a first pulse and a second pulse to said first flip-flop, said second flip-flop, said third flip-flop and said fourth flip-flop,
wherein, on the first clock pulse, said second flip-flop is operable to output the second flip-flop output to said compactor and said first flip-flop is operable to output the first flip-flop output to said second flip-flop, and
wherein, on the second clock pulse, said second flip-flop is operable to output the first flip-flop output to said compactor.

13. The device of claim 9, further comprising:
a second debug output line arranged to receive first flip-flop output; and
a multiplexer arranged to receive the second flip-flop output from said debug output line, to receive the first flip-flop output from said second debug output line and to output one of the second flip-flop output and the first flip-flop output,
wherein said first flip-flop is arranged to additionally receive the third flip-flop output.

14. The device of claim 13, further comprising:
a clock signal line operable to provide a clock signal having a first pulse and a second pulse to said first flip-flop, said second flip-flop, said third flip-flop and said fourth flip-flop,
wherein, on the first clock pulse, said second flip-flop is operable to output the second flip-flop output to said debug output line and said fourth flip-flop is operable to output the fourth flip-flop output to said second flip-flop,
wherein, on the first clock pulse, said second flip-flop is operable to output the first flip-flop output to said second debug output line and said third flip-flop is operable to output the third flip-flop output to said first flip-flop,
wherein, on the second clock pulse, said second flip-flop is operable to output the fourth flip-flop output to said debug output line, and
wherein, on the second clock pulse, said first flip-flop is operable to output the third flip-flop output to said second debug output line.

15. The device of claim 13, further comprising:
a clock signal line operable to provide a clock signal having a first pulse and a second pulse to said first flip-flop, said second flip-flop, said third flip-flop and said fourth flip-flop,
wherein, on the first clock pulse, said second flip-flop is operable to output the second flip-flop output to said compactor and said first flip-flop is operable to output the first flip-flop output to said second flip-flop,
wherein, on the first clock pulse, said fourth flip-flop is operable to output the fourth flip-flop output to said compactor and said third flip-flop is operable to output the third flip-flop output to said fourth flip-flop,
wherein, on the second clock pulse, said second flip-flop is operable to output the first flip-flop output to said compactor, and
wherein, on the second clock pulse, said fourth flip-flop is operable to output the third flip-flop output to said compactor.

16. The device of claim 13, wherein the debug input is based on the outputted one of the second flip-flop output and the first flip-flop output.

17. A method of testing a circuit having a decompressor, a first scan chain, a second scan chain, a compactor and a debug output line, the first scan chain having a first flip-flop and a second flip-flop, the second scan chain having a third flip-flop and a fourth flip-flop, said method comprising:
  providing, via an automatic test engine, a test output;
  receiving a resultant input;
  receiving a debug input;
  monitoring the debug input;
  comparing the test output with the resultant input;
  receiving, at the decompressor, a decompressor input based on the test output;
  outputting, from the decompressor, a first decompressor output and a second decompressor output;
  receiving, at the first scan chain, a first scan chain input based on the first decompressor output;
  receiving, via the first flip-flop, a first flip-flop input based on the first scan chain input;
  generating, via the first flip-flop, a first flip-flop output;
  receiving, via the second flip-flop, a second flip-flop input based on the first flip-flop output;
  generating, via the second flip-flop, a second flip-flop output;
  receiving, at the second scan chain, a second scan chain input based on the second decompressor output;
  receiving, via the third flip-flop, a third flip-flop input based on the second scan chain input;
  generating, via the third flip-flop, a third flip-flop output;
  receiving, via the fourth flip-flop, a fourth flip-flop input based on the third flip-flop output;
  generating, via the fourth flip-flop, a fourth flip-flop output;
  receiving, via the compactor, a first compactor input based on second flip-flop output,
  receiving, via the compactor, a second compactor input based on the fourth flip-flop output;
  outputting, via the compactor, a compactor output; and
  receiving, via the debug output line, the second flip-flop output,
  wherein tile resultant input is based on the compactor output, and
  wherein the second flip-flop is arranged to additionally receive the fourth flip-flop output.

18. The method of claim 17, wherein the debug input is based on the second flip-flop output.

19. The method of claim 18, further comprising:
  providing, via a clock signal line, a clock signal having a first pulse and a second pulse to the first flip-flop, the second flip-flop, the third flip-flop and the fourth flip-flop,
  wherein, on the first clock pulse, the second flip-flop outputs the second flip-flop output to the debug output line and the fourth flip-flop outputs the fourth flip-flop output to the second flip-flop, and
  wherein, on the second clock pulse, the second flip-flop outputs the fourth flip-flop output to the debug output line.

20. The method of claim 18, further comprising:
  providing, via a clock signal line, a clock signal having a first pulse and a second pulse to the first flip-flop, the second flip-flop, the third flip-flop and the fourth flip-flop,
  wherein, on the first clock pulse, the second flip-flop outputs the second flip-flop output to the compactor and the first flip-flop outputs the first flip-flop output to the second flip-flop, and
  wherein, on the second clock pulse, said second flip-flop is operable to output the first flip-flop output to said compactor.

* * * * *